United States Patent [19]

Fletcher et al.

[11] 3,906,374

[45] Sept. 16, 1975

[54] SYMMETRICAL ODD-MODULUS FREQUENCY DIVIDER

[76] Inventors: James C. Fletcher, Administrator of the National Aeronautics and Space Administration, with respect to an invention of Alexander Engel, La Canada, Calif.

[22] Filed: Mar. 12, 1974

[21] Appl. No.: 450,503

[52] U.S. Cl. ................................ 328/41; 307/225 R

[51] Int. Cl.² ......................................... H03K 21/00

[58] Field of Search............ 328/39, 41; 307/220 R, 307/225 R

[56] References Cited

UNITED STATES PATENTS 3,328,702 6/1967 Brown................................. 328/39

3,721,904 3/1973 Verhoeven........................... 328/39

*Primary Examiner*—Siegfried H. Grimm

*Attorney, Agent, or Firm*—Monte F. Mott; Paul F. McCaul; John R. Manning

[57] ABSTRACT

A frequency divider arrangement that can be used for division by an odd number and which provides a symmetrical output. It comprises an exclusive Or gate followed by a divide by 2N counter where (2N−1) equals the odd number. Input to the exclusive Or gate is from a pulse source and from the counter output.

6 Claims, 3 Drawing Figures

SYMMETRICAL ODD-MODULUS FREQUENCY DIVIDER

ORIGIN OF INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

This invention is directed to frequency dividers and more particularly to symmetrical odd-modulus frequency dividers.

OBJECTS AND SUMMARY OF THE INVENTION

An object of this invention is to provide a novel circuit arrangement for a symmetrical odd-modulus frequency divider.

Yet another object of this invention is the provision of a simple circuit arrangement for obtaining an odd-modulus frequency divider with a symmetrical output.

The foregoing and other objects of the arrangement are achieved by applying the signals, whose frequency is to be divided by an odd-modulus to one input to an exclusive OR gate. The input signal must be symmetrical. The output of the exclusive OR gate is applied to a divide-by-2N counter, where $(2N-1)$ = odd modulus or frequency of division. This can be made up of, but is not limited to, any divide-by-N counter followed by a flip flop circuit.

The output of the divide-by-2N counter is fed back as the second input to the exclusive OR gate. The output signal frequency is then related to the input signal frequency as follows: $F_{out} = F_{in}/(2N - 1)$.

DESCRIPTION OF THE PREFERRED EMBODIMENTS

Figure 1:
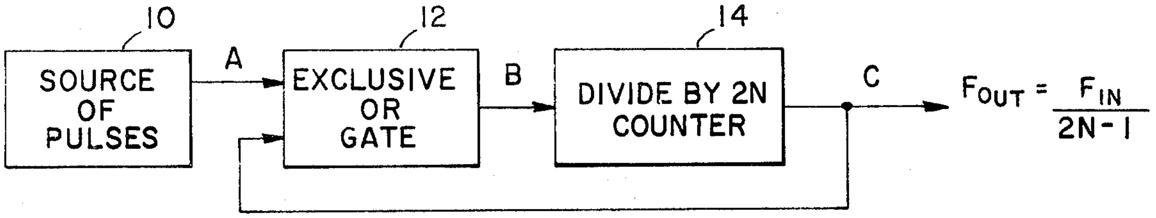
FIG. 1 is a block schematic diagram of an embodiment of the invention.

Referring now to FIG. 1, there will be seen a block schematic diagram of an embodiment of this invention. It comprises a source of symmetrical pulses 10 at the frequency to be divided, whose output is applied as one input to an exclusive OR gate 12. The output of the exclusive OR gate 12 drives a divide-by-2N counter 14. The output of the divide-by-2N counter consititutes the output of the system and is also fed back as the other input to the exclusive OR gate 12. The exclusive OR gate functions in a well known manner to provide an output in response to either one of its inputs but in the presence of both inputs no output is obtained.

Figure 2:
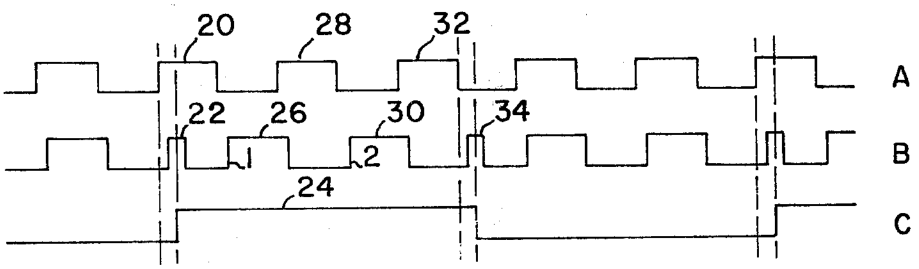
FIG. 2 is a waveform diagram illustrating the waveforms obtained with the circuit diagram of FIG. 1 when the counter is triggered by the positive edge of the input pulses.
Figure 3:
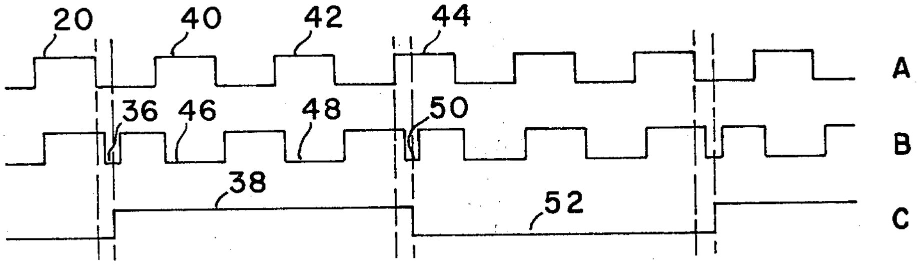
FIG. 3 is a waveform diagram illustrating the kinds of waveforms obtained with the same circuit, illustrated in FIG. 1, when the counter is a negative-edge-triggered counter.

The letters A, B and C respectively indicate, the input waveform to the system, the output of the exclusive OR gate which is applied to the divide-by-2N counter, and the output of the system, which is also fed back to the exclusive OR gate input. In FIG. 2, the waveforms are shown for the situation where the counter is triggered by positive-going waveform edges, and FIG. 3 illustrates the waveforms at the locations A, B and C when the counter is of the type which is triggered by negative-going pulse edges. In order to better illustrate the operation of the invention, but not by way of a limitation, assume that it is desired to divide the frequency of the pulses received from the source 10, by the modulus 5. Then $2N - 1 = 5$ and therefore, $2N = 6$ and $N = 3$. Thus, the counter 14 is a divide-by-6 counter which can be made up of three flip flops. The basic 2N counter can be binary or binary coded decimal or whatever type is desired. It may also be made by adding a flip flop to divide-by-N counter to divide by 2N.

In FIGS. 2 and 3, the waveform A represents the output from the source of pulses 10. Assume now that the output has provided two pulses and a third pulse 20, is applied to the exclusive OR gate. In response thereto, delayed by the propagation time through the exclusive OR gate, pulse 22 will appear at the output of the exclusive OR gate. In response to the leading edge of the pulse 22, the divide-by-2N counter counts a third count whereby its output goes high as represented by the waveform 24. As soon as the output of the last stage of the counter goes high, the pulse 22 is terminated because at this time, pulses are present at both inputs to the exclusive OR gate.

As soon as the pulse 20 terminates, the output of the exclusive OR gate rises up to provide a pulse 26, since the output of the counter is still applied to one of its inputs. The leading edge of this pulse increases the count in the counter by one.

The next pulse output 28, from the source of pulses, terminates the pulse 26 since the pulse 24 is still being applied to the other input to the exclusive OR gate. Upon the termination of the pulse 28, a pulse 30 appears at the output of the exclusive OR gate and its positive-going leading edge causes the counter to add a fifth count. Upon the appearance of the next output from the source of pulses, pulse 32, the pulse 30 is terminated. When the pulse 32 terminates, the output of the exclusive OR gate rises to provide a pulse 34. This causes the divide-by-2N counter to count another count, whereupon it reaches the count of 6, at which time its output falls. When the pulse output of the divide-by-2N counter drops, so does the output of the exclusive OR gate since at that time there is no input applied to either of its input terminals.

The next three pulses applied by the source of pulses to the exclusive OR gate, are essentially passed through to be counted by the counter. During this interval, the output of the counter is low. Upon the occurrence of the third pulse, the operation of the circuit will occur in the manner that has just been described. The divide-by-2N counter will then provide a positive-going output.

It will be seen from the waveform diagram shown in FIG. 2 that over the interval of the occurrence of five pulses from the source of pulses, a single pulse cycle is provided by the output of the divide-by-2N counter which is high or positive for one half of the interval and low or negative for the second half of the interval.

Considering the waveforms in FIG. 3, upon the occurrence of the negative-going or trailing edge of the waveform 20, on the assumption that the counter has previously counted to two, the output from the exclusive OR gate will go negative as represented by the waveform 36. In response thereto, the counter will add another count whereby its output goes positive and provides the waveform 38.

In the presence of the pulse 38, each time the source of pulses provides an output pulse, such as the pulses 40, 42, 44, the output from the exclusive OR gate will go low, as represented by the pulses 46, 48, and 50. Thus, three negative-going signals are counted by the counter with the result that in response to the third negative-going signal, the last stage of the counter is driven so that the pulse 38 is terminated and the output of the counter for the next three counts is down, as represented by the waveform 52. Over the next three count intervals, the output from the exclusive OR gate is similar to the input received from the source of pulses. Thereafter, the output stage of the counter goes high and the operation of the system is as has just been described.

Here again, it will be seen that the output of the system is symmetrical and represents an odd-modulus frequency division of the input.

The simplicity of the design of the system should be appreciated from the foregoing. For any odd-modulus by which it is desired to divide a frequency, the value of N is determined. The divide-by-2N counter is then obtained as well as an exclusive OR gate with connections being made as shown in the circuit diagram.

There has therefore been described herein above a novel, useful and simple symmetrical, odd-modulus frequency divider.

What is claimed is:

1. A system for dividing the signals from a symmetrical frequency source by an odd-modulus and achieving a symmetrical output comprising a counter having an input and an output indicative of its 2N count state, where N equals the odd-modulus division desired plus one divided by two, and gate means for applying either output signals from said symmetrical frequency source or the 2N count state output of said counter to said counter input to be counted whereby the frequency of the full count state output of said counter is an odd-modulus of the frequency of said symmetrical frequency source and said counter produces a symmetrical waveform output in response to each 2N input pulses.

2. A system as recited in claim 1 wherein said gate means is an exclusive OR gate.

3. A system as recited in claim 1 wherein said counter counts only in response to positive-going signal wavefronts.

4. A system as recited in claim 1 wherein said counter counts only in response to negative-going signal wavefronts.

5. A system for dividing the signals from a symmetrical frequency source by an odd-modulus and achieving a symmetrical output comprising an exclusive OR gate having a first and second input and an output, a counter having an input and a 2N count output, where N equals the odd-modulus division desired plus one divided by two, means to apply signals from the source of signals to the first input to said exclusive OR gate, means to apply the 2N count output of said counter to said exclusive OR gate's second input, means to apply the output of said exclusive OR gate to said counter to be counted, and means to derive a symmetrical waveform output of said counter in response to 2N input pulses to said OR gate from said source.

6. A system as recited in claim 5 wherein said 2N count output of said counter comprises the full count state output of said counter.

* * * * *